Jan. 29, 1952

B. SALZBERG 2,583,598

MODULATION

Filed Nov. 13, 1945

Inventor

BERNARD SALZBERG

By Ralph L Chappell

Attorney

Patented Jan. 29, 1952

2,583,598

UNITED STATES PATENT OFFICE 2,583,598

MODULATION

Bernard Salzberg, Washington, D. C.

Application November 13, 1945, Serial No. 628,334

10 Claims. (Cl. 332—40)

Figure 1:
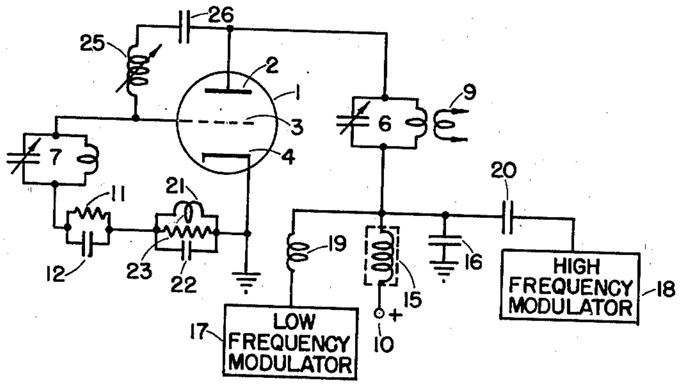

(Granted under the act of March 3, 1883, as amended April 30, 1928; 370 O. G. 757)

This invention relates to the modulation of radio frequency voltages, and is particularly directed to the problem of modulating a very high frequency voltage wave with another voltage of frequency which, while lower than the carrier frequency, lies within the band of high frequencies commonly employed as carriers in radio transmission circuits.

The invention also comprehends the modulation of a very high frequency carrier with modulating frequencies extending from low audio voltages up to relatively high frequencies such as are used in radio communication.

The invention further comprehends the modulation of a very high frequency carrier with a band of high modulation frequencies such as would represent a portion of the spectrum normally used for radio transmission.

In numerous applications it is necessary to modulate the carrier frequency voltages with modulating frequencies extending into the relatively high radio frequency band. For high-quality television broadcasting, for instance, modulation components up to a frequency of 10 or 15 megacycles may be required in the composite signal to be radiated. In other applications it may be desirable to employ modulating frequencies as high as 30 megacycles.

Known methods of effecting modulation have been found inoperative when high frequencies such as the latter mentioned figure are used. At conventional low modulating frequencies, such as those which make up a speech wave, plate modulation of an oscillator or amplifier may be satisfactorily effected. With higher modulating frequencies, however, attempts to obtain a substantial percentage modulation renders the conventional oscillator or amplifier circuit inoperative. The present invention provides means for effecting such high frequency modulation.

It is accordingly an object of the invention to modulate a carrier with a very high frequency wave.

It is another object of the invention to modulate a carrier with a plurality of components including audio frequency voltages and high radio frequency voltages.

Another object of the invention is to provide a modulated oscillator for generating a carrier modulated with very high frequency voltages.

A further object of the invention is to provide a modulated amplifier which will be effective when very high frequency modulating voltages are applied.

Figures 2, 3, 4, 5:
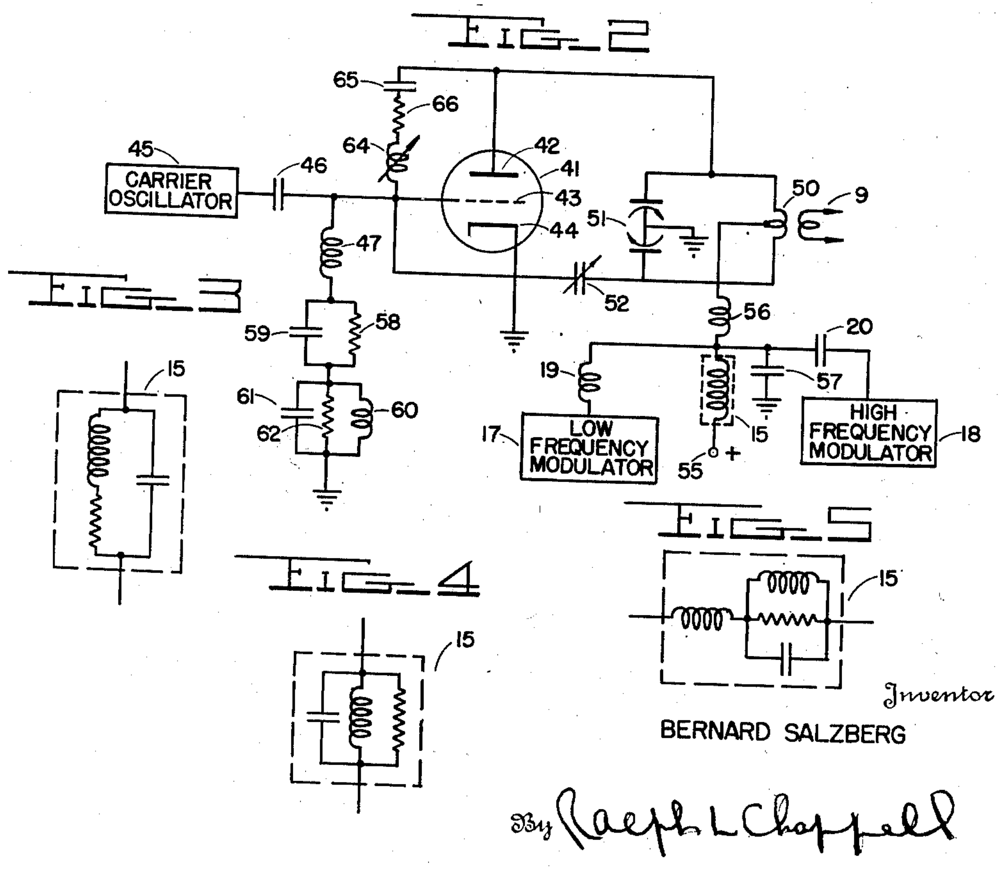

Whereas the invention may be applied to plate modulation of such vacuum tube circuits as common-grid, common-plate or common-cathode oscillators and amplifiers, for the purposes of illustration it will be described in connection with the two exemplary embodiments shown in the drawings, in which:

Fig. 1 discloses a modulated oscillator of the common-cathode type,

Fig. 2 discloses a modulated amplifier of the common-cathode type, and

Figs. 3, 4, and 5 show networks suitable for use in the circuits of Figs. 1 and 2.

The circuit of Fig. 1 comprises a modulated oscillator of the common-cathode type. This consists of a vacuum tube 1, shown as a triode. The triode is provided with anode 2, control grid 3, and cathode 4. Cathode 4 may be indirectly heated, and the heating element is not shown in the figure.

The triode is connected in an oscillating circuit which comprises a plate tank 6 and a grid tank 7. Oscillation is effected through the distributed grid-anode capacitance within the tube 1. Oscillator output for radiation from an antenna may be taken from tank 6 by coil 9.

In the specific oscillating circuit shown, anode 2 is energized in series through tuned circuit 6 from a positive source of potential 10. Cathode 4 is directly returned to ground. Grid 3 is returned to ground through biasing resistor 11 which is in parallel with by-pass condenser 12.

The circuit components described are effective in producing oscillation at the carrier frequency. In order to effect modulation, an impedance 15 is connected between the source of positive potential 10 and the plate-tank circuit 6, across which the modulating potential may be developed. Impedance 15 in series with the D. C. voltage supply 10 is shunted by by-pass capacitor 16, which, while offering a very low impedance to the carrier frequency nevertheless offers a substantial impedance to all modulating frequencies.

A simple inductance as shown at 15 in Fig. 1 would be ineffective at very high modulating frequencies because of its distributed capacitance. If it is desired to modulate with a band of frequencies from low audio to relatively high radio frequencies, a video type circuit may be employed as shown in Fig. 3.

If it is desired to modulate with a relatively narrow band of radio frequencies, the circuit of Fig. 4 may be used. An arrangement for audio and a band of radio modulating frequencies is shown in Fig. 5.

In the circuit shown two sources of modulating potential are supplied. A low frequency modulator 17 is provided, and a high frequency modulator 18. Both modulators feed the anode circuit of the oscillator with voltages developed across anode impedance 15. The high modulating frequency components are decoupled from the low frequency modulator by a series inductance 19. This inductance offers a very high impedance both to the carrier and the high frequency modulating components, but substantially low impedance to the low frequency modulating components. Low modulating frequency components are decoupled by capacitor 20.

With the conventional components thus far described, it is not possible to effect any substantial amount of modulation from the high frequency modulator 18, even though tank circuits 6 and 7 are deliberately broadened in frequency response to prevent sideband frequency trimming. This is due to the fact that at substantial modulation percentages stable oscillator operation requires proper grid bias variation during the modulation frequency cycle. This cannot take place in conventional circuits due to the fact that the series grid resistor 11 is shunted by a capacitor 12 which constitutes an effective by-pass to the high modulating frequency components of the grid current. In order, therefore, to permit the application of the proper modulating frequency voltage components to the control grid 3 for maintaining proper bias during the modulating frequency cycle, a series component offering susbtantial impedance to the modulating frequency is provided in the grid-return circuit. In the embodiment shown this component comprises a network selectively responsive to different frequencies, and adjusted to offer a substantial impedance to the high modulating frequency, while being highly conductive to the carrier component. This network will therefore permit the development of a substantial modulating frequency voltage on the control grid resulting from flow of electron grid current.

In the specific embodiment shown, the impedance network is anti-resonant at the high modulating frequencies. The network comprises an inductance 21 in parallel with a capacitance 22, the combination being tuned to the high modulating frequency. In order to limit the impedance offered to the modulating frequency, the anti-resonant network is damped by resistor 23 which may be conveniently adjusted to effect optimum operating conditions.

It has been further determined, however, that with vacuum tubes where a substantial grid-anode capacitance exists, as in the triode shown, the grid-anode reactance at high modulating frequencies is sufficiently low so that current of modulating frequency flows through anode-to-grid capacitance and through the network 21, 22, 23, to ground. Such flow of modulating frequency current through this path builds up a modulating voltage across the network formed by elements 21, 22, 23 which is opposite in phase to that developed by flow of electron grid current through the tube, resulting in improper operation.

In applications where the grid-anode capacitance is sufficiently high to prevent proper operation of the oscillator under the conditions above described, normal operation may be attained through the inclusion of circuit components provided by the invention. In the circuit in Fig. 1 these comprise a variable inductance 25, which may be slug tuned, connected between the grid and anode in series with a blocking capacitor 26. Capacitor 26 is selected to offer substantially low impedance to the high modulating frequency. The effect of this circuit arrangement is to convert the low reactance of the grid-anode capacitance to a very much higher reactance at modulation frequency, thus reducing the detrimental flow of modulation frequency current through network 21, 22, 23. The reactance of the grid-anode path at carrier frequency remains substantially unaltered. The grid potential may then vary in proper phase in accordance with the modulating variations in the grid circuit current resulting from electron flow.

In a specific embodiment of the circuit shown in Fig. 1, the carrier frequency was 700 megacycles per second, the high modulating frequency was 30 megacycles per second, and the low frequency modulator supplied communication signals in the audio range.

In case a broad band distribution of high frequency modulating components is to be applied to the carrier, it is advantageous that the compensating network be operative over a wide band instead of being sharply tuned as in Fig. 1. For such purposes many broad band networks are known in the art, having particularly been developed in connection with broad band video frequency amplifiers. A simple network of broad frequency characteristics is shown as an example in Fig. 2.

The embodiment of the invention shown in Fig. 2 illustrates its application to a modulated amplifier of the neutralized common-cathode type. The circuit includes a triode 41 having anode 42, grid 43 and indirectly heated cathode 44. Excitation is obtained from a source of carrier frequency voltage, shown as a carrier oscillator 45. In the example, the carrier oscillator is coupled to the grid through capacitor 46 and the grid drive is developed across a carrier frequency choke 47 connected in series with the grid return. The choke 47 offers low impedance to all modulating frequencies.

The plate tank circuit includes inductance 50 and balanced condenser 51. Grid-plate neutralization is obtained at carrier frequency through an adjustable capacitor 52, connected between the plate tank and grid 43.

In this circuit the anode potential is supplied from source 55 and is fed through series impedance 15. As in the circuit of Fig. 1, this may be designed as shown in Figs. 3, 4, or 5. The latter is by-passed to ground at the carrier frequency through by-pass capacitor 57, which offers substantially no impedance to the carrier frequency, but at the same time does not function as a by-pass condenser to any of the modulating frequency components. Impedance 56 is connected to plate tank coil 50 through a carrier frequency choke coil 56, offering low impedance to all modulating frequencies.

As in Fig. 1, high frequency modulating components are supplied by modulator 18, and low frequency modulation is supplied from modulator 17.

The grid return circuit includes resistor 58 shunted by a capacitor 59 acting as a by-pass to the carrier frequency and also to the high frequency modulation. As in Fig. 1, a series component offering substantial impedance to the high modulation frequency is provided. This comprises the network including inductance 60, capacitor 61 and resistance 62. This network is broadly anti-resonant at the high modulating frequency and permits the development of voltage components of modulation frequencies on the grid. The grid circuit is returned to ground.

The operation of the circuit thus described is similar to that of Fig. 1, and develops the proper grid bias during the modulating voltage cycle. When the grid-anode capacitance plus the neutralizing capacitance 52 is substantial, the reactance of the combination at high modulating frequencies is sufficiently low so that current of modulating frequency flows through anode-to-grid capacitance and through the network 60, 61, 62 to ground. Such flow of modulating frequency current through this path builds up a modulating voltage across the network formed by elements as 60, 61, 62 which is opposite in phase to that developed by flow of electron grid current through the tube, resulting in improper operation. Circuit components similar to those of Fig. 1 may be employed to minimize and counteract this effect.

These components include variable inductance 64 connected between the grid and anode in series with blocking capacitor 65 which offers substantially no impedance to the modulating frequency, and damping resistance 66. Inductance 64 may be adjusted for anti-resonance with the distributed grid-anode capacitance plus neutralizing capacitance 52 at the high modulating frequency, and through the action of the damping resistor a substantially broad band may be covered. Since the effect of the grid-to-anode capacitance will not be sufficient to paralyze the amplifier through the low frequency modulation, the circuit permits wide band modulation from the audio range to very high frequency.

It will be understood that the embodiments of the invention described above are exemplary only and that the scope thereof will be determined from the appended claims.

The invention described herein may be manufactured and used by or for the Government of the United States of America for governmental purposes without the payment of any royalties thereon or therefor.

What is claimed is:

1. A modulation circuit comprising a vacuum tube having a control grid, an anode, said electrodes having distributed capacitances therebetween, and a cathode, means for applying a carrier frequency voltage between the control grid and cathode, modulating means for applying a high frequency modulation voltage to the anode, said modulation frequency voltage being operative to apply a high modulation frequency current drive on the grid through said distributed capacitance, and inductive means connected between the grid and anode operative to resonate the grid-anode capacitance in parallel at the high modulating frequencies.

2. A modulated oscillator comprising a vacuum tube having a control grid, an anode, said electrodes having distributed capacitance therebetween, and a cathode, circuit means connecting with the grid and anode to establish oscillation, modulating means for applying a high frequency modulation voltage to the anode, said modulation frequency voltage being operative to apply a high modulation frequency current drive on the grid through said distributed capacitance, and inductive means connected between the grid and anode operative to resonate the grid-anode capacitance in parallel at the high modulating frequency.

3. A modulated amplifier comprising a vacuum tube having a control grid, an anode, said electrodes having distributed capacitance therebetween, and a cathode, means for applying a carrier frequency voltage between the control grid and cathode, modulating means for applying a high frequency modulation voltage to the anode, said modulation frequency voltage being operative to apply a high modulation frequency current drive on the grid through said distributed capacitance, and inductive means connected between the grid and anode operative to resonate the grid-anode capacitance in parallel at the high modulating frequency.

4. A modulation circuit comprising a vacuum tube having a control grid, an anode, said electrodes having distributed capacitance therebetween, and a cathode, means for applying a carrier frequency voltage between the control grid and cathode, modulating means for applying an audio modulation frequency voltage to the anode, modulating means for applying a high frequency modulation voltage on the anode, said high modulation frequency voltage being operative to apply a high modulation frequency current drive on the grid through said distributed capacitance, and inductive means connected between the grid and anode operative to resonate the grid-anode capacitance in parallel at the high modulating frequencies.

5. A modulation circuit comprising a vacuum tube having a control grid, an anode, said electrodes having distributed capacitance therebetween, and a cathode, means for applying a carrier frequency voltage between the control grid and cathode, modulating means for applying a high frequency modulation voltage to the anode, said high modulation frequency voltage being operative to apply a high modulation frequency current drive on the grid through said distributed capacitance, inductive means connected between the grid and anode operative to resonate the grid-anode capacitance in parallel at the high modulating frequencies, and circuit means connected between the grid and cathode presenting a high impedance at the high modulating frequencies.

6. A modulated oscillator comprising a vacuum tube having a control grid, an anode, said electrodes having distributed capacitance therebetween, and a cathode, circuit means connecting with the grid and anode to establish oscillation, modulating means for applying a high frequency modulation voltage to the anode, said high modulating frequency voltage being operative to apply a high modulation frequency current drive on the grid through said distributed capacitance, inductive means connected between the grid and anode operative to resonate the grid-anode capacitance in parallel at the high modulating frequency, and circuit means connected between the grid and cathode presenting a high impedance to the high modulating frequencies.

7. A modulated amplifier comprising a vacuum tube having a control grid, an anode, said electrodes having distributed capacitance therebetween, and a cathode, means for applying a carrier frequency voltage between the control grid and anode, modulating means for applying a high frequency modulation voltage to the anode, said modulation frequency voltage being operative to apply a high modulation frequency current drive on the grid through said distributed capacitance, inductive means connected between the grid and anode operative to resonate the grid-anode capacitance in parallel at the high modulating frequency, and circuit means connected between the grid and cathode presenting a high impedance to the high modulating frequencies.

8. A modulation circuit comprising a vacuum tube having a control grid, an anode, said electrodes having distributed capacitance therebetween, and a cathode, modulating means for applying an audio modulation frequency voltage to the anode, modulating means for applying a high frequency modulation voltage to the anode, said high modulation frequency voltage being operative to apply a high modulation frequency current drive on the grid through said distributed capacitance, inductive means connected between the grid and anode operative to resonate the grid-anode capacitance in parallel at the high modulating frequency, and circuit means connected between the grid and cathode presenting a high impedance to the high modulating frequencies.

9. A modulation circuit comprising a vacuum tube having a control grid, an anode, a cathode, means for applying a carrier frequency voltage between the control grid and cathode, modulating means for applying a high frequency modulation voltage to the anode, a grid return circuit receiving current drawn by said grid, and anti-resonant circuit means in said grid return circuit presenting a high impedance at the high modulating frequencies.

10. A modulation circuit comprising a vacuum tube having a control grid, an anode, said electrode having distributed capacity therebetween, and a cathode, means for applying a carrier frequency voltage between the control grid and cathode, modulating means for applying a high frequency voltage to the anode, said modulation frequency voltage being operative to apply a high modulation frequency current drive on the grid through said distributed capacity, and means operative responsively to the modulating means to apply a voltage of inverse phase at the high modulation frequency to the grid whereby a grid voltage variation resulting from the distributed electrode capacity is counteracted.

BERNARD SALZBERG.

REFERENCES CITED

The following references are of record in the file of this patent:

UNITED STATES PATENTS

| Number | Name | Date |
|---|---|---|
| 1,558,909 | Nichols | Oct. 27, 1925 |
| 2,262,139 | Gottier | Nov. 11, 1941 |
| 2,402,598 | Charchian | June 25, 1946 |